United States Patent
Yap et al.

(10) Patent No.: US 9,281,286 B1
(45) Date of Patent: Mar. 8, 2016

(54) MICROELECTRONIC PACKAGES HAVING TEXTURIZED SOLDER PADS AND METHODS FOR THE FABRICATION THEREOF

(71) Applicants: Weng F. Yap, Chandler, AZ (US); Alan J. Magnus, Gilbert, AZ (US)

(72) Inventors: Weng F. Yap, Chandler, AZ (US); Alan J. Magnus, Gilbert, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 14/470,679

(22) Filed: Aug. 27, 2014

(51) Int. Cl.
 *H01L 21/00* (2006.01)
 *H01L 23/00* (2006.01)

(52) U.S. Cl.
 CPC ............. *H01L 24/03* (2013.01); *H01L 24/05* (2013.01); *H01L 2224/0362* (2013.01); *H01L 2224/03466* (2013.01); *H01L 2224/05548* (2013.01)

(58) Field of Classification Search
 CPC .......... H01L 2924/00; H01L 2224/48227; H01L 2924/00014; H01L 2224/32225; H01L 2224/73265; H01L 2224/48091; H01L 2924/15311; H01L 2224/48465; H01L 2924/00012; H01L 2224/16225; H01L 24/03; H01L 24/05; H01L 2224/03466; H01L 2224/0362; H01L 2224/05548

USPC ......................................................... 438/106
See application file for complete search history.

(56) References Cited

U.S. PATENT DOCUMENTS

| | | | |
|---|---|---|---|
| 6,201,305 B1 * | 3/2001 | Darveaux et al. | 257/779 |
| 6,246,587 B1 | 6/2001 | Chen | |
| 6,362,435 B1 | 3/2002 | Downey et al. | |
| 8,258,633 B2 * | 9/2012 | Sezi et al. | 257/782 |
| 2004/0099716 A1 | 5/2004 | Yuan et al. | |
| 2004/0238970 A1 * | 12/2004 | Alcoe | 257/786 |
| 2006/0237855 A1 * | 10/2006 | Kroehnert et al. | 257/779 |
| 2014/0131882 A1 * | 5/2014 | Law | H01L 23/481 257/774 |

* cited by examiner

*Primary Examiner* — Jessica Stultz
*Assistant Examiner* — Vu A Vu
(74) *Attorney, Agent, or Firm* — Ingrassia Fisher & Lorenz, P.C.

(57) ABSTRACT

Microelectronic packages and methods for fabricating microelectronic packages having texturized solder pads, which can improve solder joint reliability, are provided. In one embodiment, the method includes forming a texturized dielectric region having a texture pattern, such as a hatch pattern, in an under-pad dielectric layer. A texturized solder pad is produced over the texturized dielectric region. The texturized solder pad has a solder contact surface to which the texture pattern is transferred such that the area of the solder contact surface is increased relative to a non-texturized solder pad of equivalent dimensions.

20 Claims, 5 Drawing Sheets

MICROELECTRONIC PACKAGES HAVING TEXTURIZED SOLDER PADS AND METHODS FOR THE FABRICATION THEREOF

TECHNICAL FIELD

Embodiments of the present invention relate generally to microelectronic packaging and, more particularly, to microelectronic packages and methods for fabricating microelectronic packages having texturized solder pads, which can enhance solder joint reliability.

BACKGROUND

A microelectronic package commonly includes one or more Redistribution Layers (RDLs) over which a Ball Grid Array (BGA) is produced. The RDLs contain electrically-conductive interconnect lines, which electrically couple the BGA solder balls to the microelectronic device or devices (e.g., semiconductor die) contained within the package. The interconnect lines are defined by patterning one or metal levels, which are interspersed with alternating dielectric layers. A microelectronic package can contain a single patterned metal level or, possibly, five or more metal levels depending upon the wiring complexity of the package. The final or outermost metal level is typically patterned to include flat solder pads joined to the interconnect lines. A solder mask layer is deposited over the last metal level, and openings are formed in the solder mask layer to expose the solder pads. The BGA solder balls are then deposited in the solder mask openings and contact the solder pads. Heat treatment is carried-out to reflow the BGA solder balls such that solder joints are formed between the solder balls and the underlying solder pads. Fabrication of the microelectronic package can then be completed by, for example, singulation of a panel or wafer containing the microelectronic package. A secondary solder reflow process may also be carried-out when the microelectronic package is mounted to a larger system or device, such as a Printed Circuit Board (PCB).

Fabrication processes of the type described above typically produce solder joints of at least moderate mechanical strength, which is adequate for most applications. However, the mechanical strength of the solder joints formed between the solder pads and the BGA solder balls can be undesirably limited in certain instances, such as when a microelectronic package is subject to high impact loads or to significant vibratory forces during usage. Considering this, it is desirable to provide microelectronic packages and methods for fabricating microelectronic packages having enhanced solder joint strength and reliability. Ideally, embodiments of such a fabrication method could be utilized to produce various different types of microelectronic packages, such as Fan-In Wafer Level Packages (FI-WLPs) and Fan-Out Wafer Level Packages (FO-WLPs), with relatively few additional processing steps to minimize manufacturing time, cost, and complexity. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
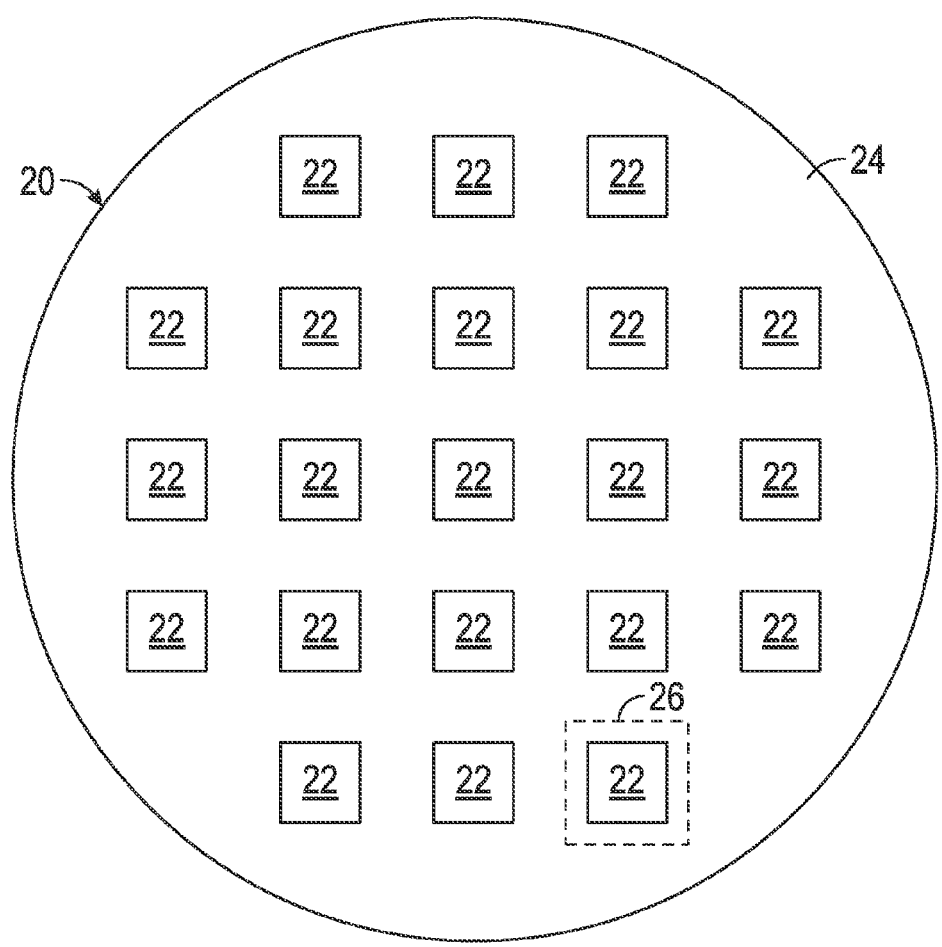
FIG. 1 is a top-down view of an exemplary molded panel in which a plurality of semiconductor die has been embedded and which may undergo further processing to produce a plurality of microelectronic devices having texturized solder pads, in accordance with embodiments of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes exemplary embodiments of microelectronic packages and methods for producing microelectronic packages having texturized solder pads. The solder pads are "texturized" in the sense that a pattern of relatively small grooves, cavities, or depressions is created in the upper surfaces of the pads, which are contacted by solder when a BGA solder ball or other solder contact is bonded thereto. This increases the surface area of the solder pads available for bonding during solder reflow; and, in effect, creates a mechanical locking feature, enhancing the strength and reliability of the solder joint created between the texturized solder pads and the solder contacts. In accordance with embodiments of the present invention, the desired texture pattern is imparted to the solder pads by first texturizing selected regions of an under-pad dielectric layer, which underlie the solder pads. The texturized solder pads can then be produced by the conformal deposition and patterning of a solder-wettable, electrically-conductive layer, such as the outermost or final metal level of the RDLs included within the microelectronic package. In preferred embodiments, selected regions of the under-pad dielectric layer are texturized by photolithographical patterning. In such embodiments, texturing of the under-pad dielectric layer can be carried-out in conjunction with formation of the RDLs to enable the texturized solder pads to produced with relatively few additional processing steps.

By way of non-limiting illustration, an exemplary embodiment of the fabrication method will now be described in conjunction with the manufacture of an exemplary FO-WLP, as shown at various stages of completion in FIGS. 2-9 and produced by processing the molded panel shown in FIG. 1. The following description notwithstanding, embodiments of the fabrication method can be utilized to produce different types of microelectronic packages having texturized solder pads including, but not limited to, FI-WLPs or Chip Scale Packages (CSPs). For example, processing steps similar to those described below can be performed to produce a plurality of FI-WLPs containing texturized solder pads; however, in this alternative case, the processing steps would be carried-out utilizing a semiconductor wafer containing an array of non-singulated semiconductor die as opposed to a molded panel in which a number of singulated die have been embedded. After wafer level processing, the semiconductor wafer can then be singulated to yield a plurality of discrete FI-WLPs each having a number of texturized solder pads. Prior to singulation of the semiconductor wafer, solder balls or other solder contacts can then be bonded to the texturized solder pads in the manner described below to impart the completed FI-WLPs with enhanced-strength solder joints.

In embodiments wherein the fabrication method is utilized to produce FO-WLPs, processing can be carried-out utilizing a molded panel in which an array of semiconductor die has been embedded. An example of a molded panel 20 containing a number of semiconductor die 22 is shown from a top-down view in FIG. 1. For the purposes of explanation, molded panel 20 is shown as containing a relatively small array of microelectronic devices consisting only of substantially identical semiconductor die 22. This example notwithstanding, it will be appreciated that the semiconductor die embedded within molded panel 20 need not be identical and may vary in shape, dimensions, and/or layout in further embodiments. Additionally, various other types of microelectronic devices (e.g., passive components, such as inductors, resistors, capacitors, and the like) can be embedded within molded panel 20 along with semiconductor die 22 when it is desired to produce System-in-Package (SiP) FO-WLPs. Molded panel 20 includes a panel body having an upper principal surface 24 (referred to herein as "frontside 24") at which the respective frontsides of semiconductor die 22 are exposed. At this juncture in the fabrication process, semiconductor die 22 have undergone wafer level processing and each carry one or more Integrated Circuits (ICs). Bond pads (e.g., bond pads 32 shown in FIGS. 2-5 and 7-9) are disposed on the frontsides of die 22 to provide points-of-contact to the circuits carried thereby. As explained below, one or more RDLs are subsequently built-up over the frontside of molded panel 20 and contain electrically-conductive interconnect lines, which are electrically coupled to the bond pads of the embedded die 22.

By way of non-limiting example, one process suitable for producing molded panel 20 is performed as follows. First, semiconductor die 22 are distributed in a desired spatial arrangement over the upper surface of a temporary substrate, such as a layer of adhesive tape (not shown). If desired, one more release layers may also be applied or otherwise formed over the carrier's supper surface prior to positioning of the die. A mold frame, which has a central cavity or opening therethrough, is positioned over the temporary substrate and around the array of semiconductor die 22 utilizing a pick-and-place tool. A dielectric mold compound or encapsulant, such as a silica-filled epoxy, is dispensed into the cavity of the mold frame and flows over semiconductor die 22. The encapsulant is then solidified by, for example, an oven cure to yield a solid panel body in which semiconductor die 22 are embedded. Molded panel 20 can be produced as a relatively thin, disc-shaped body or mass having a generally circular planform geometry; however, panel 20 can be fabricated to have any desired dimensions and planform shape. The panel body is then released from the temporary substrate to reveal frontside 24 of panel 20 through which die 22 are exposed. If desired, the backside of the panel body may be ground or polished to bring molded panel 20 to a desired thickness prior to release of the panel body from the carrier. In further embodiments, molded panel 20 can be produced utilizing other known fabrication techniques, such as compression molding and lamination processes.

One or more RDLs are next produced over frontside 24 of molded panel 20 and the semiconductor die 22 embedded therein. In accordance with embodiments of the present invention, texturized solder pads are produced in conjunction with build-up of the RDLs such. FIGS. 2-5 and 7-9 are cross-sectional views taken through a portion of the molded panel 20 containing a single semiconductor die 22 (generally demarcated in FIG. 1 by dashed box 26), which illustrate one manner in which a number of RDLs 28 (identified in FIGS. 3-9) and texturized solder pads 50 (identified in FIGS. 5-9) can be produced over molded panel 20. Hereafter, the following description and the accompanying figures will focus primarily on the processing of the portion of molded panel 20 shown in FIGS. 2-5 and 7-9; and the production of a single FO-WLP. The FO-WLP is identified by reference numeral "30" and is shown in a partially-completed state in FIGS. 2-8 and in a completed state in FIG. 9. While the following description focuses on the processing of the region of molded panel 20 from which FO-WLP 30 is produced, it will be understood that the below-described process steps will typically be performed globally across molded panel 20 and for all die 22 to produce a plurality of completed FO-WLPs in parallel with FO-WLP 30. Each FO-WLP produced form panel 20 will typically contain one or more of semiconductor die 22 shown in FIG. 1, as well as the other structural features (e.g., texturized bonds pads) described below.

Figure 2:
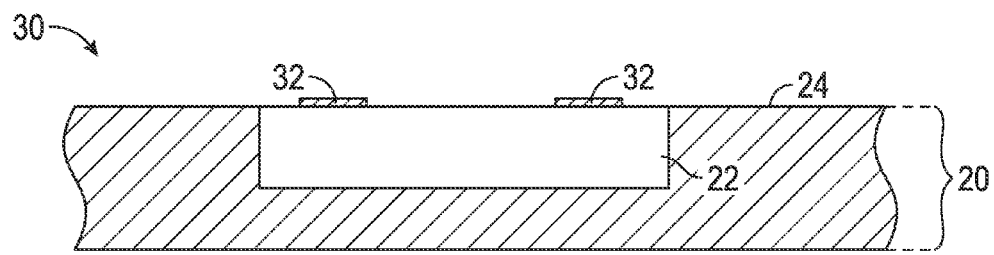
FIGS. 2-5 are cross-sectional views of a microelectronic package shown at various stages of completion, which can be produced utilizing the molded panel shown in FIG. 1 and which is illustrated in accordance with a first exemplary embodiment of the microelectronic package fabrication method.
Figure 3:
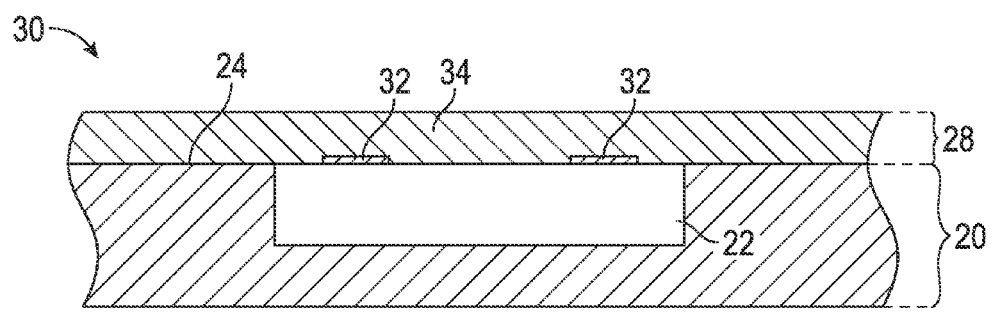
Figure 4:
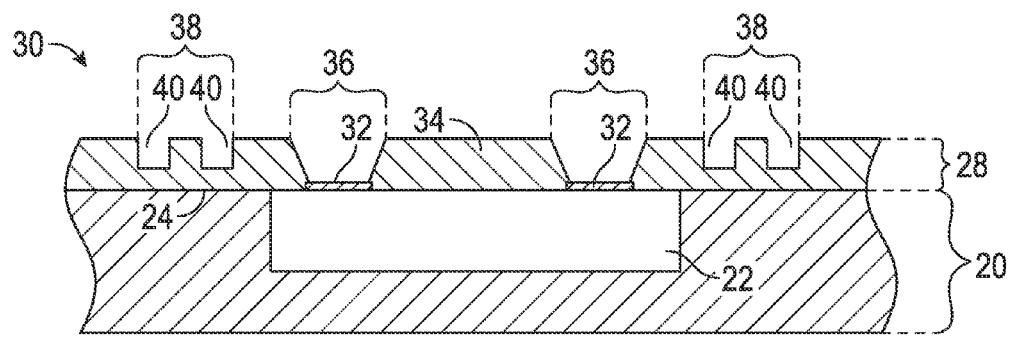

Referring initially to FIG. 2, FO-WLP 30 is shown prior to build-up of RDLs 28 (identified in FIGS. 3-9). Semiconductor die 22 includes a frontside over which a plurality of bond pads 32 are disposed (only two of which are visible in FIG. 2). The frontside of die 22 and, therefore, bond pads 32 are exposed at frontside 24 of molded panel 20. Molded panel 20 is attached to a non-illustrated support structure in a face-up orientation to facilitate build-up of RDLs 28. RDL build-up can commence with the deposition of a first photoimagable dielectric layer 34 (shown in FIG. 3). In one embodiment, dielectric layer 34 is deposited over molded panel 20 by spin-on application. Dielectric layer 34 can be deposited to a thickness between about 5 microns (μm) and about 20 μm in an embodiment; the term "about," as appearing herein, denoting a disparity of less than 10%. However, layer 34 can be thicker or thinner in further embodiments. As indicated in FIG. 3, dielectric layer 34 is formed over semiconductor die 22 and covers bond pads 32. To again reveal bond pads 32, via openings 36 are formed in dielectric layer 34 by, for example, lithographic patterning. The term "via opening" is defined herein as an opening or tunnel formed through one or more dielectric layers and in which an electrically-conductive feature is later produced to provide electrically-conductive path through the dielectric layers. FIG. 4 illustrates FO-WLP 30 after patterning of dielectric layer 34 and the formation of via openings 36, which extend through layer 34 to expose bond pads 32 of semiconductor die 22.

A metal level is next formed over patterned dielectric layer 34. Depending upon the wiring complexity of FO-WLP 30

(and the other FO-WLPs produced from panel 20 shown in FIG. 1), RDLs 28 can be produced to include multiple metal levels, which are interspersed with alternating dielectric layers. As briefly noted above, the texturized solder pads are usefully produced in conjunction with the outermost or last metal level by texturing selected regions of the dielectric layer underlying the last metal level (referred to herein as the "under-pad dielectric layer"). In the relatively simple embodiment shown in FIGS. 2-9, FO-WLP 30 is produced to include a single metal level overlying dielectric layer 34. This metal level is therefore the "last" or "outermost" metal level, and dielectric layer 34 is the "under-pad dielectric layer" in the context of the present example. Accordingly, the regions of dielectric layer 34 over which solder pads will subsequently formed are first texturized prior to formation of the last metal level. Etching or another process can be employed to texturize selected regions of dielectric layer 34. However, in a preferred embodiment, selected regions of dielectric layer 34 are texturized by photolithographical patterning. FIG. 4 further illustrates FO-WLP 30 as including two texturized dielectric regions 38, which are formed in dielectric layer 34 by lithographical patterning. Texturized dielectric regions 38 are defined by relatively small cavities, openings, or channels 40 (referred to herein as "texturize features 40"). Texturizing features 40 are formed in the upper surface of dielectric layer 34 and can be repeated across regions 38 in a predetermined pattern, as discussed more fully below in conjunction with FIG. 6.

In the illustrated embodiment, a photolithographical patterning process is utilized to produce via openings 36 and texturized dielectric regions 38 in under-pad dielectric layer 28. For manufacturing efficiency, it may be desirable to produce via openings 36 and texturized dielectric regions 38 simultaneously utilizing a single or common developing process. At the same time, it may be desirable to impart via openings 36 and texturizing features 40 with different depths. In particular, while via openings 36 are formed to extend through under-pad dielectric layer 28, it may be preferred that texturizing features 40 do not fully penetrate dielectric layer 28. In this case, texturize features 40 can be formed to have a maximum feature depth less than the average thickness of dielectric layer 28. For example, texturize features 40 can be formed to have a maximum feature depth between about 1 and about 4 µm, while dielectric layer 28 can have a thickness exceeding 5 µm in an embodiment. Prior to development of under-pad dielectric layer 34, those areas of dielectric layer 34 in which via openings 36 are formed can be exposed to a higher dosage of ultraviolet (UV) light than are those areas of layer 34 in which texturizing features 40 are formed. Stated differently, the regions of dielectric layer 34 in which the texture pattern is formed can be treated with a first predetermined UV dosage, while the regions of layer 34 in which the via openings are formed are treated with a second predetermined UV dosage greater than the first predetermined dosage. A common developing step can then be carried-out to simultaneously form via openings 36 and texturizing features 40, while imparting features 40 with an average depth shallower than the depths of via openings 36. By preventing texturize features 40 from fully penetrating dielectric layer 28, undesired electrical contact or coupling between the solder pad formed over texturized dielectric regions 38 and any electrically-conductive features located beneath layer 28 (e.g., interconnect lines contained within an underlying metal level) is avoided. In further embodiments, such as in embodiments wherein electrically-conductive features are not present under texturized dielectric regions 38, texturize features 40 can extend fully through under-pad dielectric layer 28.

Figure 5:
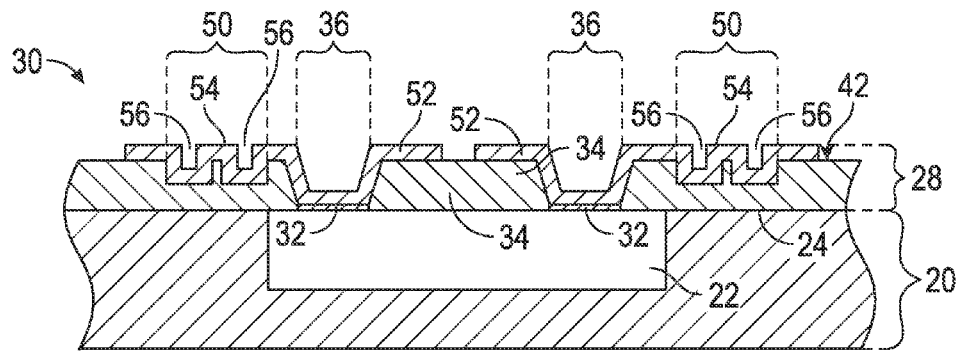

Advancing to FIG. 5, a patterned metal level 42 is next produced over under-pad dielectric layer 28. In one embodiment, patterned metal level 42 is produced by first depositing a seed layer, applying a photoresist coating over the seed layer, developing the photoresist coating to expose selected regions of the seed layer, plating the exposed regions of the seed layer, stripping the photoresist, and then etching away the non-plated portions of the seed layer to leave only the desired metal features. The seed layer can be composed of, for example, titanium tungsten (TiW) over which a thin layer of copper (Cu) is sputtered prior to deposition of a thicker Cu platting. Other materials can be utilized in further embodiments (providing that the texturized solder pads are formed from an electrically-conductive, solder wettable material), as can other fabrication processes suitable for producing patterned metal level 42. In the embodiment shown in FIG. 5, metal level 42 is patterned to include a number of texturized solder pads 50 and a number of electrically-conductive interconnect lines 52. Interconnect lines 52 extend from texturized solder pads 50 into via openings 36 to electrically couple solder pads 50 to bond pads 32 of die 22. In further embodiments wherein FO-WLP 30 is produced to include multiple metal levels, interconnect lines 52 can electrically couple solder pads 50 to other electrically-conductive routing features, such as other interconnect lines or metal plugs formed in underlying RDLs.

Metal level 48 is generally conformal with patterned dielectric layer 28 such that the texture pattern of texturized dielectric regions 38 (FIG. 4) is transferred to solder pads 50 and, specifically, to the respective upper or "solder contact" surfaces 54 of pads 50. Thus, as are texturized dielectric regions 38 (FIG. 4), texturized solder pads 50 are imparted with relatively small grooves, openings, or cavities 56 defining a texture pattern (referred to herein as "texturize features 56"). To avoid filling or "pinching-off" of texturize features 56, it is preferred that the minimum width of texturize features 40 of texturized dielectric regions 38 (FIG. 4) is at least twice the average thickness of metal level 48 and, therefore, of interconnect lines 52. In one embodiment, and by way of example only, texturize features 40 (FIG. 4) have a minimum width of about 5 µm. Texturized solder pads 50 and underlying texturized dielectric regions 38 (FIG. 4) can be formed at any desired location across FO-WLP 30. In the illustrated embodiment, texturized solder pads 50 and underlying texturized dielectric regions 38 (FIG. 4) are located laterally outboard of semiconductor die 22. Stated differently, texturized solder pads 50 and texturized dielectric regions 38 (FIG. 4) are located over the fan-out region of the molded package body, as defined by subsequent singulation of molded panel 20 (described below in conjunction with FIG. 9).

Figure 6:
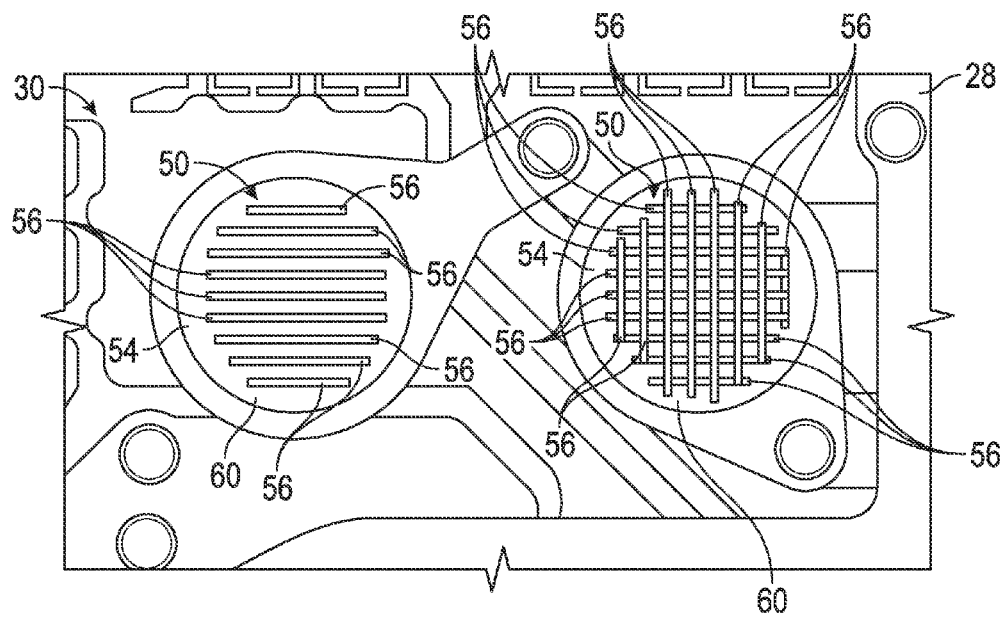
FIG. 6 is a top-down view of a region of the microelectronic package shown in FIGS. 2-5 illustrating two texturized solder pads, which are formed to have different hatch patterns in their respective upper surfaces.

The particular texture pattern formed in texturized dielectric regions 38 (FIG. 4) and transferred to texturized solder pads 50 can and will vary amongst embodiments. In certain embodiments, a stippling, checkerboard, bulls-eye, or other pattern can be created in dielectric regions 38 and transferred to texturized solder pads 50. However, in preferred embodiments, a hatch pattern is formed in texturized dielectric regions 38 (FIG. 4) and transferred to texturized solder pads 50. The term "hatch pattern" is defined herein as a pattern of closely-spaced lines, grooves, or trenches, whether or not such lines, grooves, or trenches intersect or extend parallel to one another. FIG. 6 is a top-down view of relatively small region of FO-WLP 30 on which two texturized solder pads 50 have been formed. As can be seen, the leftmost solder pad 50 has been imparted with a hatch pattern such that texturizing features 56 assume the form of series of substantially parallel grooves or lines, which extend at least partially across solder contact surface 54 of the leftmost pad 50. By comparison, the rightmost solder pad 50 shown in FIG. 6 has been imparted with a cross-hatch pattern such that texturizing features 56 assume the form of intersecting grooves or lines, which form a grid or lattice across the solder contact surface 54 of the rightmost pad 50. This example notwithstanding, texturized solder pads 50 can be imparted with any pattern of grooves, cavities, or openings able to permit the inflow of solder when texturized solder pads 50 are bonded to a solder ball or other solder contact, as described below. Similarly, any texture pattern can be crated within texturized dielectric regions 38 (FIG. 4) suitable for transferring such a pattern to solder pads 50.

Figure 7:
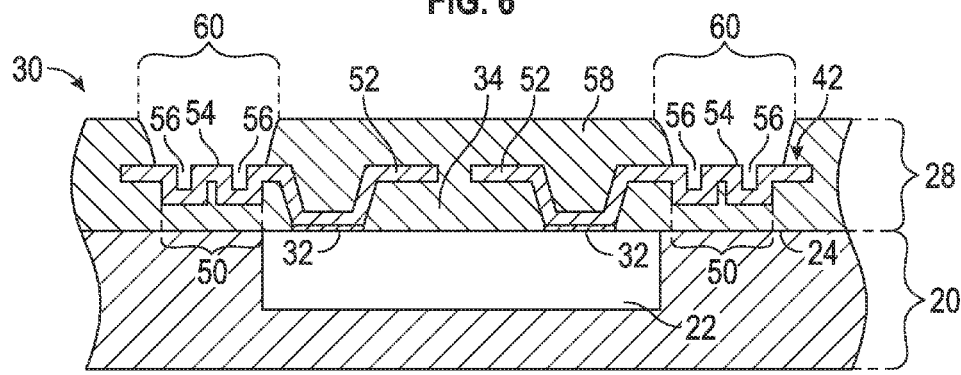
FIGS. 7-9 are cross-sectional views of the microelectronic package shown in FIGS. 2-6 (again shown at various stages of completion) and further illustrating the first exemplary embodiment of the microelectronic package fabrication method.
Figure 8:
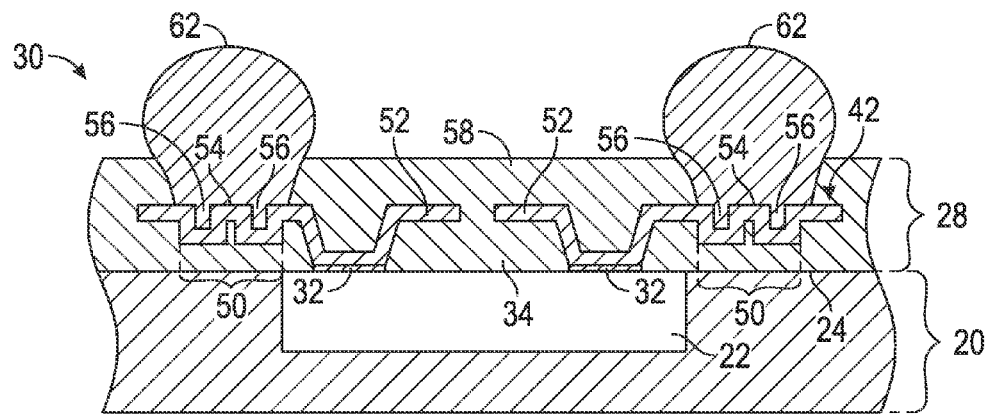

Turning to FIG. 7, a solder mask layer 58 is next deposited over patterned metal level 48 and, therefore, over texturized solder pads 50 and interconnect lines 52. Solder mask layer 58 is then patterned to create solder mask openings 60 through which texturized solder pads 50 are exposed. Solder contacts 62, such as BGA solder balls or discrete bodies of solder paste, are then deposited in or over solder mask openings 60 (shown in FIG. 8). Afterwards, heat treatment is carried-out to reflow solder contacts 62 and form a solder joint between contacts 62 and solder contact surface 54 of texturized solder pads 50. The solder wettable nature of the material (e.g., Cu) from which texturized solder pads 50 are formed promotes the flow of solder into texturize features 56 provided in solder pad contact surfaces 54. After the soldering process, the solder may fill or substantially fill texturizing features 56 with little to no voiding. Due to the texturized nature of solder pads 50, the surface area of each solder pad 50 bonded to its respective solder contact 62 is increased relative to a non-texturized solder pad of equivalent dimensions. Solder joint strength and reliability is improved as a result.

Figure 9:
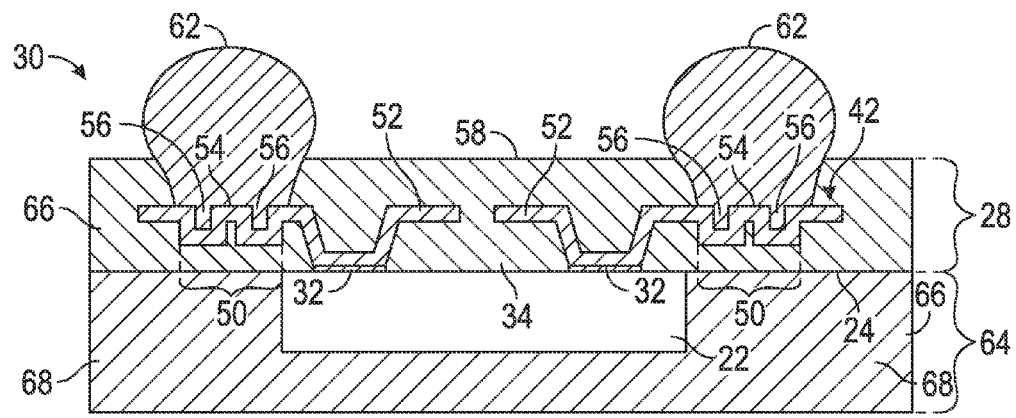

Molded panel 20 is singulated to complete fabrication of FO-WLP 30 and the other FO-WLPs produced in parallel therewith. Singulation is preferably carried-out utilizing a dicing saw; however, other singulation processes can also be utilized including, for example, laser cutting and water jetting. The resultant structure is shown in FIG. 9 wherein the singulated piece of panel 20 forms a molded package body 64 having substantially vertical sidewalls 66. As further identified in FIG. 9, molded package body 64 has a fan-out region 68 over which texturized solder pads 50 are located. Due to the increased solder joint reliability between solder contacts 62 and the underlying texturized solder pads 54, FO-WLP 30 is well-suited for usage in an environment characterized by high impact forces or significant vibratory loads; however, it will be appreciated that FO-WLP 30 and the other microelectronic packages produced pursuant to the methods described herein are not limited to any particular application or usage. It should also be appreciated that, in further embodiments, FO-WLP 30 can be initially produced and distributed without solder contacts, in which case the solder joints may be created between the texturized solder pads and the solder contacts when FO-WLP 30 is installed on a larger system or device, such as a PCB.

There has thus been provided an exemplary embodiment of a method for fabricating microelectronic packages having texturized or hatched solder pads, which can significantly enhance solder joint reliability. In the above-described embodiment, the texturized topology of the solder pads is created via the conformal deposition of one or more electrically-conductive layers over hatched dielectric regions. As noted above, the dielectric regions are preferably imparted with a desired hatch (or other texture) pattern utilizing a photoimagable patterning process, although the usage of etching or other selective material removal process to create the hatched dielectric regions is not precluded. The texturize features are preferably produced to have a maximum feature depth less than the thickness of the dielectric layer in which the features are formed and less than the depths of any via openings formed through the dielectric layer. As further noted above, the texturize features and via openings can be formed in a photoimagable, under-pad dielectric layer utilizing a common development step by varying the dosage of UV light to which different regions of the dielectric layer are exposed. In particular, the regions of the under-pad dielectric layer in which the via openings are formed can be exposed to higher dosages of UV light as compared to the regions of the dielectric layer in which the texturize features are formed. As a result, only a single additional processing step (namely, the separate UV-exposure of the texturize features) need be performed in addition to the processing steps already performed during build-up of the RDLs. Embodiments of the fabrication method can thus be integrated into existing process flows with minimal modification and additional cost.

As described above, the number of processing steps utilized to produce the FO-WLPs can be reduced by employing a common development process to form both the via openings and the texturize features of the texturized dielectric regions in a single photoimagable layer. However, in certain instances, it may be difficult to precisely control the average depth to which the texturize features are formed strictly by varying the amount of UV dosage to which different regions of a single photoimagable layer are exposed. In many cases, slight variations in the texturing feature depth will be acceptable as the under-pad dielectric layer will be sufficiently thick to accommodate such variances. Nonetheless, if it should be desired to control the texturize feature depth with a greater degree of accuracy and repeatability, this can be accomplished by first deposit a base photoimagable layer and subsequently depositing the under-pad photoimagable layer in which the texturize features are formed. In this manner, the thickness of the under-pad photoimagable layer itself can determine the maximum feature depth of the texturize features or texture pattern. An exemplary embodiment of such a fabrication process will now be described in conjunction with FIGS. 10-13.

Figure 10:
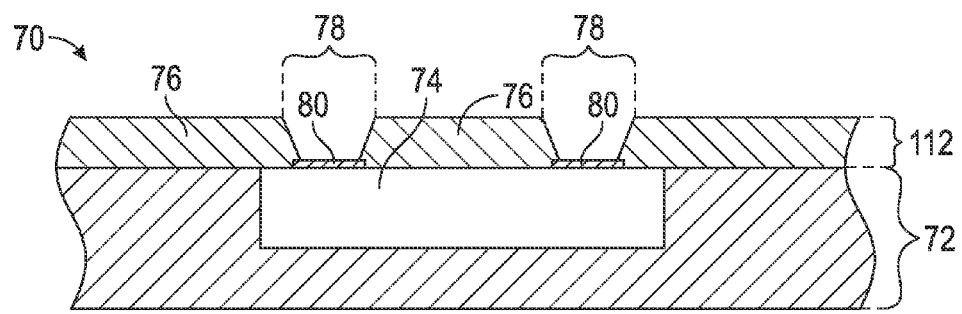
FIGS. 10-13 are cross-sectional views of a microelectronic package shown at various stages of completion and produced to include texturized solder pads, as illustrated in accordance with a further exemplary embodiment of the microelectronic package fabrication method.
Figure 11:
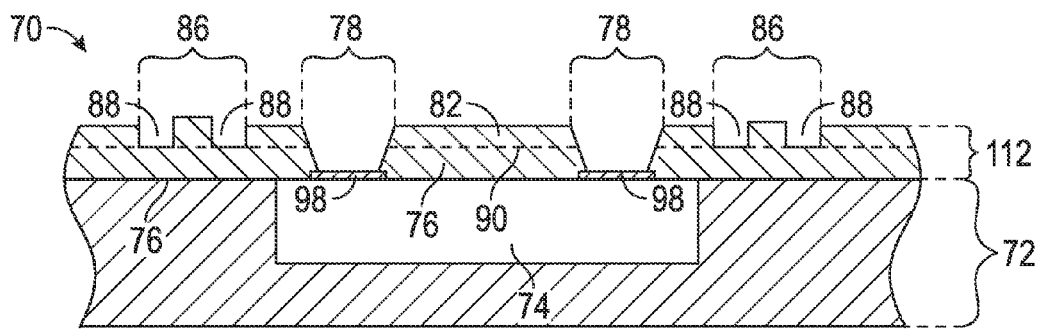

FIGS. 10-13 are cross-sectional views of a FO-WLP 70, as shown at various stages of completion and illustrated in accordance with a second exemplary embodiment of the fabrication method. Once again, FO-WLP 70 can be produced in parallel with a number of other FO-WLPs by processing a molded panel 72 (partially shown in FIGS. 10-13). A number of semiconductor die 74 are embedded in panel 72 and exposed through the frontside 76 thereof. Referring to FIG. 10, a first or base photoimagable dielectric layer 76 is deposited over frontside 74 of panel 72. After deposition, base dielectric layer 76 is photolithographically patterned to produce via openings 78 exposing a number of bond pads 80, which are located on the frontside of die 74. Next, a second or under-pad dielectric layer 82 is deposited over base dielectric layer 76 (shown in FIG. 11). Under-pad dielectric layer 82 is then lithographically patterned to produce via openings 84, which align with the previously-formed via openings 78 (FIG. 10) and expose bond pads 80 through the two layer stack. Additionally, under-pad dielectric layer 82 is further patterned to include texturized dielectric regions 86 at selected locations across layer 82. Specifically, texturize features 88 are formed in selected dielectric regions 86 to create the desired surface topology, such as a hatch pattern. Texturized dielectric regions 86 are similar to texturized dielectric regions 38 described above in conjunction with FO-WLP 30 (FIGS. 2-9); thus, additional detailed description of these regions is not provided to avoid redundancy. It should be noted, however, that texturizing features 86 penetrate through under-pad dielectric layer 82 and terminate at the interlayer interface formed between layers 76 and 82 (represented in FIG. 11 by dashed line 90). Texturizing features 88 of texturized dielectric regions 86 and via openings 84 can be produced utilizing a single UV exposure and UV development steps. Thus, the depth of texturize features 88 is determined by the thickness of under-pad dielectric layer 82, which can be controlled within relatively tight tolerances.

Figure 12:
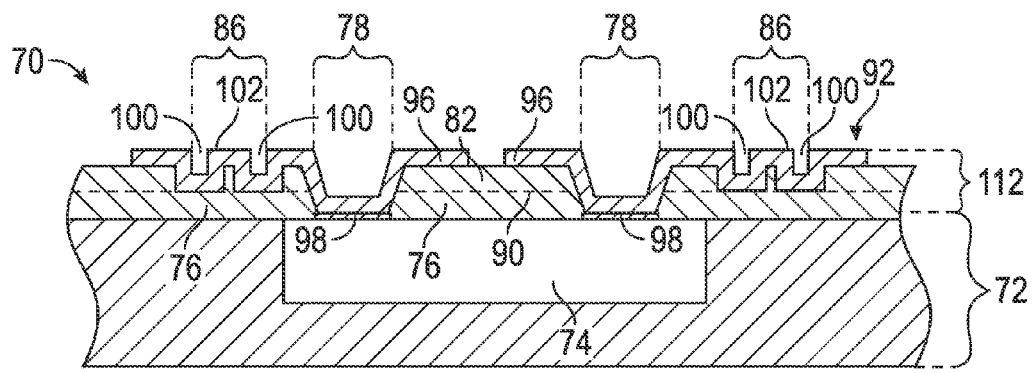
Figure 13:
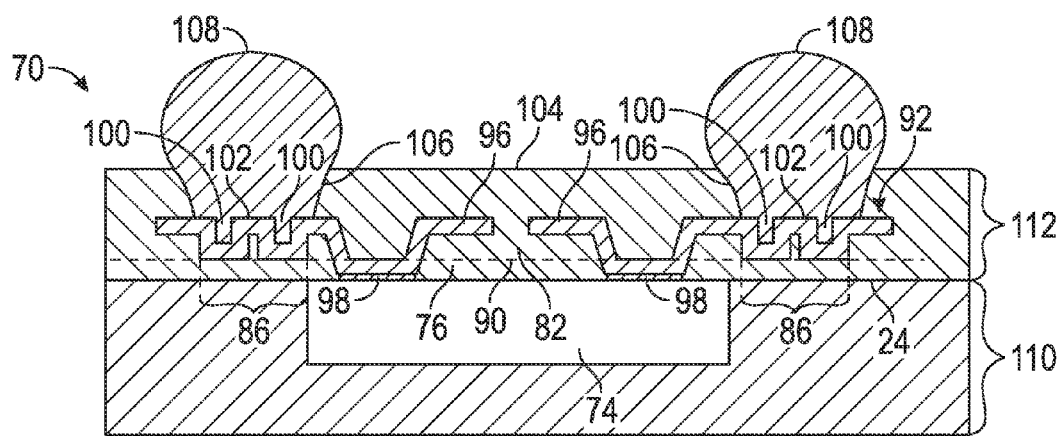

Referring to FIG. 12, a patterned metal level 92 is next produced over under-pad dielectric layer 82. Metal level 92 can be produced in the same manner as was metal level 42 described above in conjunction with FIG. 5. Patterned metal level 92 is composed of or includes an upper layer composed of a solder-wettable, electrically-conductive metal, such as Cu. As was the case previously, metal level 92 is patterned to include texturized solder pads 94 and interconnect lines 96, which electrically couple solder pads 92 to bond pads 98 of packaged die 74. Texturized solder pads 94 overlie and are conformal with texturized dielectric regions 86 (identified in FIG. 11). As a result, the hatch or other texture pattern imparted to texturized dielectric regions 86 is transferred to solder pads 94, which include texturizing features 100 formed in the respective upper or solder-contact surfaces 102 thereof. Texturized solder pads 86 are located laterally outboard of die 74 and over the fan-out region of molded package body 110; however, one or more of solder pads 86 can be located over die 22 in further embodiments. Steps similar to those described above in conjunction with FO-WLP 30 (FIGS. 2-9) can now be carried-out to complete fabrication of FO-LWP 70. For example, as shown in FIG. 13, a solder mask layer 104 can deposited over patterned metal level 92, patterned to create solder mask openings 106 therein, and then solder balls or other solder contacts 108 can be deposited into solder mask openings 106. Afterwards, solder reflow is performed to melt or soften solder contacts 108 such that solder flows into texturizing features 100 of texturized solder pads 94 and structurally robust solder joints are produced. Molded panel 72 (FIGS. 10-12) is then singulated to separate FO-WLP 70 from the other FO-WLPs produced in parallel therewith. As indicated in FIG. 13, singulation defines molded package body 110 of FO-WLP 70 in which semiconductor die 74 is embedded and over which a number of RDLs 112 have been produced. This completes fabrication of FO-WLP 70, which has an enhanced solder joint reliability due to the texturized topology of solder pads 86 and the increased bonding area created between solder pads 86 and their corresponding solder contacts 62.

There has thus been provided multiple exemplary embodiments of microelectronic packages and methods for producing microelectronic packages having texturized or hatched solder pads. Advantageously, the texturized solder pads can increase the strength and reliability of solder joints created between the solder pads and subsequently-formed solder contacts. In at least some embodiments, the desired texture pattern is imparted to the solder pads by first texturizing selected regions of an under-pad dielectric layer, which underlie the solder pads. Texturing of the under-pad dielectric layer can be carried-out in conjunction with formation of the RDLs to enable the formation of the texturized solder pads with relatively few additional processing steps. While primarily described above in conjunction with the fabrication of FO-WLPs, embodiments of the fabrication method can be utilized to produce FI-WLPs and other microelectronic packages having texturized solder pads.

In one embodiment, the fabrication method includes the step or process of forming a texturized dielectric region having a texture pattern, such as a hatch pattern, in an under-pad dielectric layer. A texturized solder pad is then produced over the texturized dielectric region. The texturized solder pad has a solder contact surface to which the texture pattern is transferred such that the area of the solder contact surface is increased relative to a non-texturized solder pad of equivalent dimensions. In a further embodiment, the method includes the steps or processes of depositing a photoimagable dielectric layer over a semiconductor die, photolithographically patterning the photoimagable dielectric layer to define texturized dielectric regions at selected locations across the first photoimagable dielectric layer, and producing a patterned metal level over the photoimagable dielectric layer. The patterned metal level is produced to include: (i) texturized solder pads formed over the texturized dielectric regions, and (ii) interconnect lines electrically coupling the solder pads to the semiconductor die. A solder mask layer is formed, which has solder mask openings through which the texturized solder pads are exposed. BGA solder balls or other solder contacts are then formed in the solder mask openings and bonded to the texturized solder pads.

In a further embodiment, the fabrication method includes the step or process of depositing a photoimagable dielectric layer over an array of semiconductor die such that the photoimagable dielectric layer covers bond pads located on the semiconductor die. The photoimagable dielectric layer is then photolithographically patterned to define: (i) texturized dielectric regions at selected locations across the first photoimagable dielectric layer, and (ii) via openings extending through the first photoimagable dielectric layer. A patterned metal level is then produced over the texturized dielectric regions and the via openings. The patterned metal level includes texturized solder pads overlying the texturized dielectric regions, as well as interconnect lines electrically coupling the texturized solder pads to the bond pads of the semiconductor die. A solder mask layer is then formed having solder mask openings through which the texturized solder pads are exposed, and BGA solder balls or other solder contacts are formed in the solder mask openings and bonded to the texturized solder pads.

Embodiments of a microelectronic package have also been provided. In one embodiment, the microelectronic package includes a texturized dielectric region having a texture pattern thereon. A texturized solder pad overlies the texturized dielectric region and having a solder contact surface. The texturized solder pad is substantially conformal with the texturized dielectric region such that the texture pattern is transferred to the solder contact surface. A solder ball overlies the texturized solder pad and is bonded to the solder contact surface. In certain embodiments, the microelectronic package can further include a first photoimagable dielectric layer in which the texturized dielectric region is formed, the first photoimagable dielectric layer having a thickness greater than the feature depth of the texture pattern. In other embodiments, the microelectronic package can further include a semiconductor die and a molded package body having a fan-out region extending around the semiconductor die, the texturized dielectric region located over the fan-out region. In still further embodiments, the microelectronic package can further include semiconductor die having a bond pad, a first photoimagable dielectric layer in which the texturized dielectric region is formed; and an interconnect line overlying the first photoimagable dielectric layer and electrically coupling the bond pad to the texturized solder pad. In such embodiments, interconnect the texturized dielectric region can have a minimum feature width greater than twice the average thickness of the interconnect line. In yet further embodiments, the microelectronic package can include an under-pad photoimagable dielectric layer in which the texturized dielectric region is formed, as well as a base photoimagable dielectric layer underlying the under-pad photoimagable dielectric layer and forming an interlayer juncture therewith. In this case, the texture pattern of the texturized dielectric region may extend to and terminate substantially at the interlayer juncture.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic device" or "microelectronic component" is utilized in a broad sense to refer to an electronic device, element, or structure produced on a relatively small scale and amenable to packaging in the above-described manner. Microelectronic devices or components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples.

What is claimed is:

1. A method for fabricating a microelectronic package, comprising:
   photolithographically patterning an under-pad dielectric layer to create a texturized dielectric region having a texture pattern and to create via openings extending through the under-pad dielectric layer; and
   producing a texturized solder pad over the texturized dielectric region, the texturized solder pad having a solder contact surface to which the texture pattern is transferred such that the area of the solder contact surface is increased relative to a non-texturized solder pad of equivalent dimensions;
   wherein the patterning comprises:
   treating the region of the under-pad dielectric layer in which the texture pattern is formed with ultraviolet (UV) light at a first predetermined dosage;
   treating the regions of the under-pad dielectric layer in which the via openings are formed with UV light at a second predetermined dosage greater than the first predetermined dosage; and
   developing the under-pad dielectric layer to simultaneously form the via openings and the texture pattern.

2. The method of claim 1 wherein forming comprises forming the texturized dielectric region such that the texture pattern has a maximum feature depth less than the thickness of the under-pad dielectric layer.

3. The method of claim 1 wherein forming comprises photolitographically patterning the under-pad dielectric layer to create the texturized dielectric region therein.

4. The method of claim 3 wherein producing comprises:
   depositing a metal level over the under-pad dielectric layer after patterning thereof; and
   patterning the metal level to define the texturized solder pad and at least one interconnect line electrically coupled to the texturized solder pad.

5. The method of claim 4 wherein the interconnect line has an average thickness, wherein the texture pattern is produced to have a minimum feature width, and wherein the minimum feature width of the texture pattern is at least twice the average thickness of the interconnect line.

6. The method of claim 1 further comprising:
   depositing a solder mask layer over the texturized solder pad;
   forming a solder mask opening in the solder mask exposing the texturized solder pad; and
   forming a solder contact over the solder mask opening and bonded to the texturized solder pad.

7. The method of claim 1 wherein depositing comprises depositing the under-pad dielectric layer over a molded panel in which at least one semiconductor die has been embedded, and wherein the texturized dielectric region and the texturized solder pads are formed at locations laterally outboard of the semiconductor die.

8. The method of claim 1 wherein the texture pattern is formed to have a maximum feature depth less than the depth of the via openings.

9. The method of claim 1 further comprising depositing the under-pad dielectric layer over a base dielectric layer such that an interlayer juncture is produced therebetween, the texture pattern formed to extend through the under-pad dielectric layer and to terminate substantially at the interlayer juncture.

10. A method for fabricating a microelectronic package, comprising:
    depositing a photoimagable dielectric layer over a semiconductor die;
    photolithographically patterning the photoimagable dielectric layer to define texturized dielectric regions at selected locations across the first photoimagable dielectric layer and to further define via openings at different locations across the first photoimagable dielectric layer, the texturized dielectric regions having a maximum feature depth less than the depth of the via openings as taken from an upper surface of the photoimagable dielectric layer;
    producing a patterned metal level over the photoimagable dielectric layer, the patterned metal level produced to include (i) texturized solder pads formed over the texturized dielectric regions, and (ii) interconnect lines electrically coupling the solder pads to the semiconductor die;

forming a solder mask layer having solder mask openings through which the texturized solder pads are exposed; and forming solder contacts in the solder mask openings and bonded to the texturized solder pads.

11. The method of claim 10 wherein the semiconductor die is embedded is a molded panel along with a number of other semiconductor die, wherein the photoimagable dielectric layer is deposited over the molded panel, and wherein the method further comprises singulating the molded panel after forming the solder contacts to produce a plurality of Fan-Out Wafer Level Packages.

12. The method of claim 10 wherein photolitographically patterning comprises photolitographically patterning the photoimagable dielectric layer to impart the texturized dielectric regions with hatch patterns.

13. The method of claim 10 further comprising depositing the photoimagable dielectric layer over a base dielectric layer such that an interlayer juncture is produced therebetween, the texture pattern formed to extend through the photoimagable dielectric layer and to terminate substantially at the interlayer juncture.

14. A microelectronic package, comprising:
a first photoimagable dielectric layer in which a texturized dielectric region having a texture pattern is formed, the first photoimagable dielectric layer having a thickness greater than a maximum feature depth of the texture pattern;
a texturized solder pad overlying the texturized dielectric region and having a solder contact surface, the texturized solder pad substantially conformal with the texturized dielectric region such that the texture pattern is transferred to the solder contact surface;
a solder contact overlying the texturized solder pad and bonded to the solder contact surface;
a semiconductor die; and
a molded package body having a fan-out region extending around the semiconductor die, the texturized dielectric region located over the fan-out region.

15. The microelectronic package of claim 14 further comprising:
a semiconductor die having a bond pad;
a photoimagable dielectric layer in which the texturized dielectric region is formed; and
an interconnect line overlying the photoimagable dielectric layer and electrically coupling the bond pad to the texturized solder pad.

16. The microelectronic package of claim 14 further comprising a base photoimagable dielectric layer underlying the first photoimagable dielectric layer and forming an interlayer juncture therewith, the texture pattern of the texturized dielectric region extending to and terminating at the interlayer juncture.

17. The microelectronic package of claim 16 further comprising a via extending through the first photoimagable dielectric layer and through the base photoimagable dielectric layer, the via formed at a location offset from the texturized solder pad and having a depth greater than the maximum feature depth of the texture pattern.

18. The microelectronic package of claim 14 wherein the texture pattern comprises a plurality of channels that are formed in, but do not penetrate through the texturized dielectric region.

19. A microelectronic package, comprising:
a first photoimagable dielectric layer in which a texturized dielectric region having a texture pattern is formed, the first photoimagable dielectric layer having a thickness greater than a maximum feature depth of the texture pattern;
a texturized solder pad overlying the texturized dielectric region and having a solder contact surface, the texturized solder pad substantially conformal with the texturized dielectric region such that the texture pattern is transferred to the solder contact surface;
a solder contact overlying the texturized solder pad and bonded to the solder contact surface;
a semiconductor die having a bond pad;
a photoimagable dielectric layer in which the texturized dielectric region is formed; and
an interconnect line overlying the photoimagable dielectric layer and electrically coupling the bond pad to the texturized solder pad;
wherein the interconnect line has an average thickness, and wherein the texturized dielectric region has a minimum feature width greater than twice the average thickness of the interconnect line.

20. The microelectronic package of claim 19 further comprising a base photoimagable dielectric layer underlying the first photoimagable dielectric layer and forming an interlayer juncture therewith, the texture pattern of the texturized dielectric region extending to and terminating at the interlayer juncture.

* * * * *